United States Patent [19]

Hollingsworth

[11] Patent Number: 4,748,490

[45] Date of Patent: May 31, 1988

[54] DEEP POLYSILICON EMITTER ANTIFUSE MEMORY CELL

[75] Inventor: Deems R. Hollingsworth, Missouri City, Tex.

[73] Assignee: Texas Instruments Incorporated, Dallas, Tex.

[21] Appl. No.: 38,457

[22] Filed: Apr. 13, 1988

Related U.S. Application Data

[63] Continuation of Ser. No. 761,638, Aug. 1, 1985, abandoned.

[51] Int. Cl.$^4$ .................. H01L 27/02; H01L 29/72; H01L 23/48
[52] U.S. Cl. ........................ 357/51; 357/34; 357/59; 357/67; 357/71
[58] Field of Search ............... 357/34.51, 59, 67, 71

[56] References Cited

U.S. PATENT DOCUMENTS

| | | | |
|---|---|---|---|
| 4,146,902 | 3/1979 | Tanimoto et al. | 357/51 |
| 4,424,578 | 1/1984 | Miyamoto | 357/51 |
| 4,441,167 | 4/1984 | Principi | 357/51 |
| 4,471,376 | 9/1984 | Morcom et al. | 357/71 |
| 4,499,557 | 2/1985 | Holmberg et al. | 365/163 |
| 4,569,120 | 2/1986 | Stacy et al. | 29/574 |
| 4,569,121 | 2/1986 | Lim et al. | 29/574 |

FOREIGN PATENT DOCUMENTS 57-20993  3/1982  Japan ........................ 357/51

OTHER PUBLICATIONS

W. R. Iversen, "Amorphous Switches Add PROM Density", *Electronics,* 4/5/84, p. 54.
W. R. Iversen, "Amorphous Vias in Wafer Link Chips", *Electronics,* 9/22/83, p. 48–49.

*Primary Examiner*—Carroll J.
*Attorney, Agent, or Firm*—James T. Comfort; Leo N. Heiting; Melvin Sharp

[57] ABSTRACT

A memory cell (10) has a bipolr decoupling element (56), (68), (82), (92) having an exterior contact (36). A refractory conductive layer (40) is formed on contact (36), and an initially nonconductive antifuse layer (48) is formed on refractory layer (40). A nonrefractory metal layer (50) is formed on the nonconductive layer (48). Blocking elements (56) (68), (82) (92) are connected to a word line (52), (78). When a specified voltage is impressed across the nonrefractory metal layer (50) and the word line (52), (78), nonrefractory metal diffuses through the initially nonconductive layer (48) to the refractory conductive layer (40) to provide a conductive path between the two.

14 Claims, 2 Drawing Sheets

DEEP POLYSILICON EMITTER ANTIFUSE MEMORY CELL

This application is a continuation, of application Ser. No. 761,638 filed Aug. 1, 1985 abandoned.

TECHNICAL FIELD OF THE INVENTION

The present invention pertains to electrically programmable memory cells, and more particularly to vertical antifuse memory cells.

BACKGROUND OF THE INVENTION

Vertical antifuse memory cells conventionally comprise a decoupling element, such as a PN junction diode, and an antifuse element electrically connected in series with the blocking element. The memory cell is connected between a bit line and word line. Initially, the antifuse exists in a nonconductive state. To program the memory cell, a voltage is selectively impressed across it to short the antifuse and thereafter cause the antifuse to exist in a highly conductive state. Shorted antifuse memory cells return a logical "1" on the bit line, and unshorted antifuse memory cells return a "0" on the bit line inherently.

Prior art antifuse constructions are shown in the following publications: "Memories," *Electronics,* Vol. 53, No. 23, p. 141 (Oct. 23, 1980); and "A 16K PROM USES VERTICAL FUSE," *Electronics,* Vol. 55, No. 4, p. 184 (Feb. 24, 1982). One of these references discloses a vertical antifuse where the memory cell comprises a polysilicon emitter above a bipolar transistor decoupling element. A layer of aluminum is disposed above the polysilicon emitter. In order to program the cell, a voltage is impressed across the aluminum and the base of the decoupling element in order to raise the temperature of the aluminum and the poly emitter up to their eutectic point, causing aluminum to spike through the emitter-base junction. This short-out of the emitter based junction leaves the base/collector junction as the decoupling element of the programmed memory cell. A disadvantage of this technique is that the current has to be sufficiently high (on the order of 100 milliamperes) to diffuse through 1500-2500 Angstroms of single crystal silicon, in addition to the polysilicon emitter. A problem exists in attempting to control the diffusion of the aluminum so that it does not short out the base/collector junction as well. The base must be wide enough to avoid the spike-through of aluminum to the collector, shorting out the entire decoupling element. This poses a restriction on scaling.

Another antifuse approach is disclosed by M. Tanimoto, et al., "A Novel Programmable 4K-Bit MOS PROM Using A Polysilicon Resistor Applicable To On-Chip Programmable Devices," *IEEE J. Solid State Circuits,* Vol. SC-17, No. 1, pp 62-68 (February 1982). An initially nonconductive polysilicon resistor fuse element is disclosed in this reference and is used in MOS applications. The resistor fuse is surrounded by phosphorus oxide. Autodoping of the polysilicon fuse by the phosphorus will occur during subsequent high temperature fabricating steps to drop the resistance of the fuse element to below 100 Kilohms. Thereafter, the resistance is further reduced by the diffusion of arsenic in order to program the antifuse element. Because arsenic and phosphorus are not highly conductive dopants, Tanimoto's resistor fuse provides an electrical path of relatively high resistance between the word line and the bit line as opposed to a path created by a highly conductive metal diffusant such as aluminum.

In view of the above problems, a need has arisen in the industry to provide a vertical antifuse structure that avoids the danger of destruction of a bipolar decoupling element upon programming and that simultaneously provides a low-resistance conductive path upon programming the cell.

SUMMARY OF THE INVENTION

The present invention comprises a memory cell having an antifuse and a decoupling element. A bipolar transistor decoupling element is preferably used for its advantages in terms of speed, low programming current and low operating current, and is at least partially formed in a single crystal semiconductor layer. A doped polysilicon emitter contact may be formed adjacent to an active emitter region of the decoupling element. A refractory conductive layer, which can be fabricated from titanium tungsten alloy, is deposited on the contact. An initially nonconductive antifuse layer, which can be reset into a conductive state by the application of a predetermined electrical potential, is formed on the refractory layer. The antifuse layer can be fabricated from undoped polycrystalline silicon or amorphous silicon. A nonrefractory metal layer is formed on top of the antifuse layer and may be connected to the bit line. The nonrefractory layer can be formed of aluminum or an aluminum alloy.

In order to program the memory cell, an electrical potential is applied across the antifuse layer and the decoupling element. The nonrefractory metal layer diffuses through the antifuse layer to the refractory layer in order to form a conductive path from the bit line the refractory layer. The refractory layer provides a barrier against diffusion of the nonrefractory metal into the decoupling element, thereby preventing the shorting of either junction of the decoupling element.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
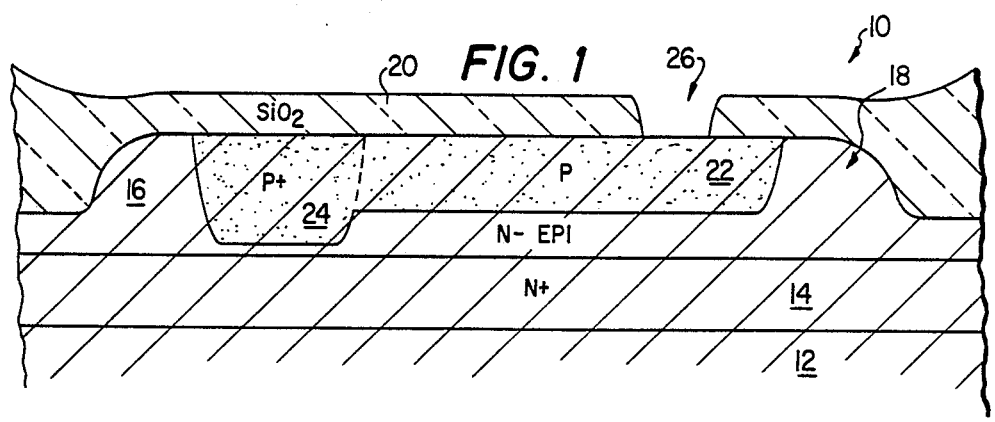
FIGS. 1-3 are elevational sections through a memory cell fabricated according to the invention, showing successive steps of fabrication.

Turning now to FIG. 1, a memory cell 10 is shown in the initial stages of its fabrication. A semiconductor substrate 12 is preferably fabricated from single crystal silicaon and is implanted with an N-type dopant to create an N+ common collector layer 14. Common collector layer 14 is preferably connected to all bipolar memory cell devices fabricated in the array. An epitaxial layer 16 is next grown on substrate 12 according to conventional techniques. Epitaxial layer 16 is lightly doped to be N-type. Epitaxial layer 16 is then etched in order to separate a plurality of raised active semiconductor regions 18, one of which is shown in FIGS. 1-3.

A 2500 Angstrom layer 20 of silicon dioxide (hereinafter "oxide") is then formed in a conventional manner on epitaxial layer 16. A base region 22 is implanted with a P-type dopant such as boron through oxide layer 20. The boron is implanted to reach a concentration of $10^{19}$–$10^{20}$ ions/cm$^3$ in base region 22. Base region 22 is preferably about 5000 Angstroms thick. A second P-type implantation is made to create a P+ base contact region 24. Since the implantation energy of the dopant used to dope base contact region 24 is greater than the implantation energy used to implant base region 22, base contact region 24 is slightly deeper than base region 22, as shown. At some point in the process, a collector contact region (not shown) will be diffused into an area of epitaxial layer 16 outside of the sectional plane shown for one or more memory cells 10 in order to provide a good electrical connection from the exterior to collector layer 14. A window 26 is next opened in oxide layer 20 and is preferably patterned and etched to be about two microns wide at its juncture with base region 22.

Figure 2:
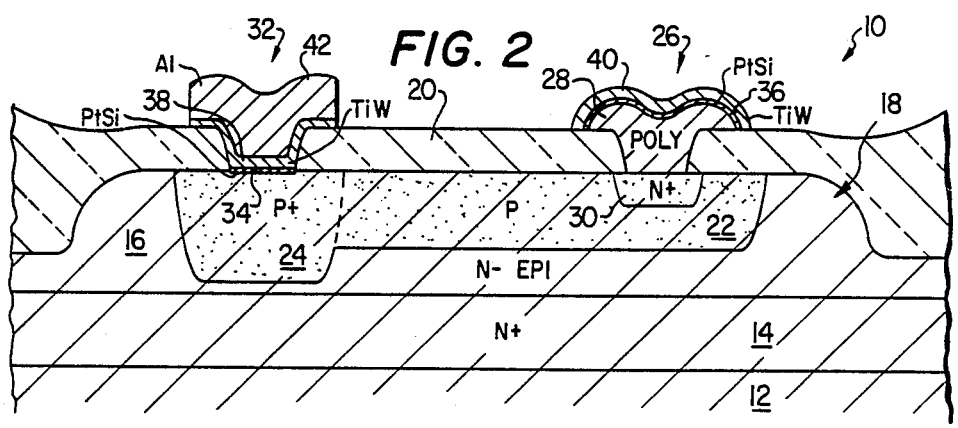
Figure 3:
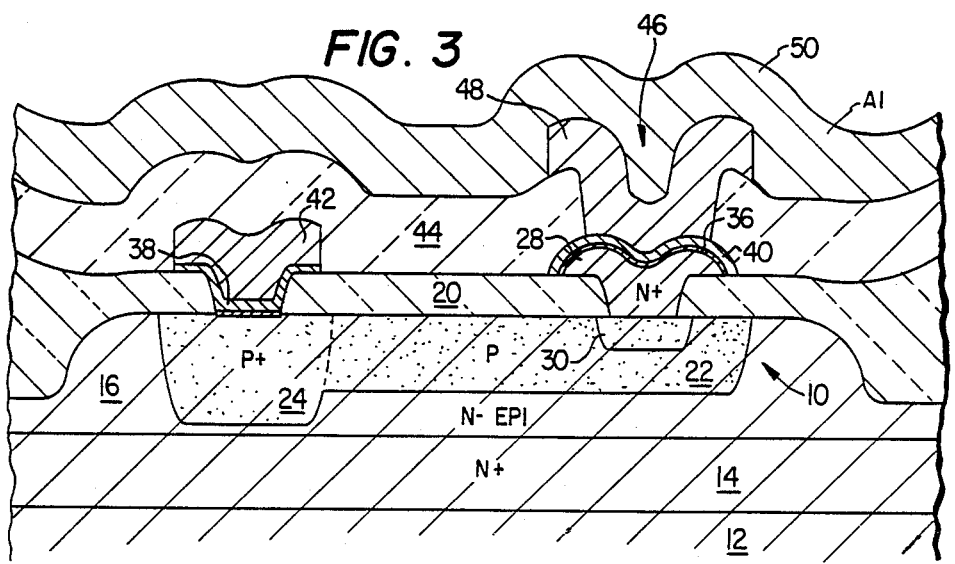

In FIG. 2, a polycrystalline silicon (hereinafter, "poly") emitter 28 is deposited, patterned and etched to occupy window 26. Poly emitter 28 may be doped before or after deposition with a high concentration of N-type dopant, such as phosphorus or arsenic. Preferably, poly emitter 28 is about 2500 Angstroms thick and has a resistivity of 40 to 45 ohms per square. Poly emitter 28 is dimensioned to be substantially larger in its exposed area than emitter window 26 in order to reduce alignment problems in subsequent steps of fabrication.

Poly emitter 28 is next subjected to a high temperature anneal step to diffuse the N-type dopant into base region 22, creating an active emitter region 30. The anneal is performed at about 1000° C. When arsenic is used as the dopant and is performed at about 900° C. when phosphorous is used. Emitter region 30 can be about 2500 Angstroms thick. The size of the emitter window 26 and therefore active emitter region 30 should be kept as small as possible in order to keep emitter leakage current down to a minimum level.

Next, a base contact via 32 is patterned and etched in oxide layer 20 to be about two microns wide. A layer 34 of platinum is then deposited in via 32 simultaneously with the deposition of a similar platinum layer 36 on polysilicon emitter 28. After layers 34 and 36 have been deposited, they are sintered at a temperature of about 450° C. to 500° C. in order to form a PtSi compound with the underlying silicon. PtSi layers 34 and 36 are deposited in order to make good ohmic contact with base contact region 24 and polysilicon emitter 28, respectively, and are each about 600 Angstroms thick. The platinum deposition step is self-aligning, as it will adhere only to exposed silicon and not on oxide layer 20.

Next, a layer of refractory conductive material, such as titanium tungsten alloy (Ti-W), tungsten or molybdenum, is deposited as by sputtering. A nonrefractory layer comprising a metal such as aluminum is then sputtered on top of the Ti-W layer. The aluminum and Ti-W layers are patterned to mask the emitter and base contact areas. An etch is then performed to define a refractory conductive base contact layer 38 and a nonrefractory layer or word line 42 and a refractory conductive poly emitter layer 40. A pad of aluminum (not shown) at this point remains on top of layer 40. Layers 38 and 42 are then masked and an aluminum - specific etch is applied to the emitter area to remove the aluminum and expose refractory layer 40. As composed of Ti-W, refractory layers 38 and 40 are preferably about 1700 Angstroms thick. Refractory layers 38 and 40 are deposited in order to prevent the spike-through of any nonrefractory metal deposited on top of them, such as aluminum from an aluminum layer.

Nonrefractory layer 42 can be aluminum or an aluminum alloy such as a 98% aluminum and 2% copper alloy. Refractory layer 40 is preferably dimensioned to be about three microns wide.

Referring to FIG. 3, an interlevel oxide layer 44 is next deposited over oxide layer 20, nonrefractory base contact layer 42 and refractory emitter layer 40. Interlevel oxide layer 44 is formed by conventional techniques such as RF plasma deposition, and is preferably about 6000 Angstroms thick. An antifuse via 46 is then opened in oxide layer 44 so as to expose a central area of refractory layer 40. Antifuse via 46 is vertically aligned over prior emitter via 26 and is preferably less than or equal to about two microns wide at its narrowest point.

Next, an antifuse layer 48 is patterned and etched to occupy the area around and in via 46. Antifuse layer 48 may be formed of amorphous silicon and can be deposited by a plasma deposition technique at a temperature of about 300° C. In the plasma deposition technique, dichlorosilane or unhalogenated silane is introduced into a reactive plasma chamber and the silane is broken down in order to deposit the amorphous silicon. Alternatively, antifuse layer 48 maybe formed of undoped polysilicon and deposited by a low pressure chemical vapor deposition (LPCVD) technique at a temperature ranging from 500° C. to 600° C. In this case, antifuse layer 48 would be deposited before nonrefractory base contact layer 42.

The thickness of antifuse layer 48 is variable according to the programming voltage requirements of the system. The thickness can range between 500 to 6800 Angstroms for a resultant programming range from about four to five volts to about twelve to sixteen volts. Preferably, antifuse layer 48 is about three microns wide at its widest point in order to alleviate any alignment problems encountered during subsequent steps of fabrication. Amorphous silicon is a preferred material for antifuse layer 48 because the process occurs at a lower temperature. Antifuse layer 48 preferably has a resistance in its unprogrammed, nonconductive state condition exceeding 200 Kilohms.

To complete the structure of memory cell 10, a nonrefractory conductive layer 50 is deposited, patterned and etched to cover antifuse layer 48 and electrically connect it to the system. Nonrefractory layer 50 is preferably formed of a metal alloy consisting of or comprising aluminum, such as the 98% aluminum - 2% copper alloy as previously described. Nonrefractory conductive layer 50 is preferably about 7000 Angstroms thick. In this embodiment, layer 50 serves as the bit line of the memory cell, and conductive layer 42 serves as the word line.

Completed memory cell 10 includes a polysilicon emitter 28 in the illustrated embodiment. Poly emitter 28 provides advantages in enhancing the current gain of epitaxial emitter region 30 and in reducing vertical alignment problmens encountered during fabrication of cell 10. Nevertheless, antifuse layer 48 could be employed in a structure without poly emitter 28. In this case, PtSi layer 36 would be adjacent emitter region 30, and layers 40, 48 and 50 would be downwardly displaced.

In order to program any one memory cell 10, a predetermined voltage such as 15 volts is impressed across layer 50 and layer 42 and a programming current such as 5 milliamperes is passed through antifuse layer 48. This current is sufficient to raise the temperature of aluminum layer 50 and antifuse layer 48 to their eutectic point, allowing aluminum from layer 50 to diffuse or "spike through" layer 48 and provide a conductive path to refractory layer 40. As previously explained, refractory layer 40 prevents aluminum from layer 50 from diffusing downwardly any further. In its programmed or "blown closed" state, antifuse layer 48 has a resistance less than or equal to about 50 ohms.

Figure 4:
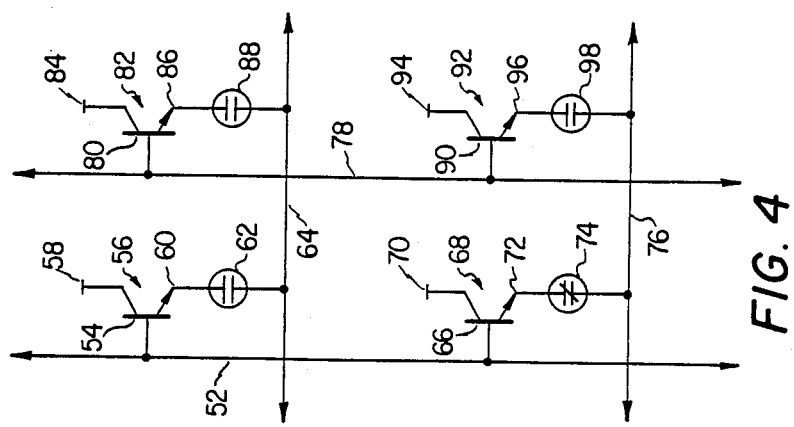
FIG. 4 is a schematic electrical diagram showing a 2×2 section of bipolar memory cells in a memory array.

Referring now to FIG. 4, an electrical schematic diagram of a 2×2 section memory cell array is shown that employs the memory cell of the invention. A word line 52 is connected to a base 54 of a bipolar transistor decoupling element 56. Decoupling element 56 has a collector 58 that has a potential of twelve volts during the programming stage and is held at five volts during post-programming operation of the device. An emitter 60 of bipolar transistor decoupling element 56 is connected to an antifuse 62, which in turn is connected to a bit line 64. Word line 52 is also connected to a base 66 of a second bipolar transistor decoupling element 68. Decoupling element 68 has a collector 70 and an emitter 72. Emitter 72 is connected to an antifuse element 74, shown here in a "blown" or shorted condition, which in turn is connected to bit line 76.

A second word line 78 is connected to a base 80 of a bipolar transistor decoupling element 82. Decoupling element 82 has a common collector 84 and an emitter 86 that is connected to an antifuse element 88. Antifuse element 88 is in turn connected to bit line 64. Second word line 78 is also connected to a base 90 of a bipolar transistor decoupling element 92. Decoupling element 92 has a common collector 94 and an emitter 96, the last of which is connected to an antifuse 98. Antifuse 98 is in turn connected to bit line 76.

Although separated for clarity, collectors 58, 70, 84 and 94 are preferably connected together to provide a common-collector operation of the array.

During the programming of a conventional antifuse used in connection with a bipolar decoupling element, the emitter-base junction of the decoupling element is "blown" or shorted at the same time that the antifuse element is shorted, leaving a collector-base junction diode as the decoupling element of the cell. In FIG. 4, transistors 56, 68, 82 and 92 remain intact during and after the programming step, enhancing the programming speed and the post-programming operational speed of the array.

In order to program antifuse 74, for example, a predetermined programming voltage is impressed across word line 52 and bit line 76, while collector 70 is held at a constant, such as 12 volts. Except for a V$_{BE}$ across base 66 and emitter 72, the programming voltage will appear directly across the antifuse 74, heating it up until it shorts. Decoupling element 68 and antifuse 74 will thereafter return a "1" bit down bit line 76, while the remainder of the memory cells with return "0" bits, or vice versa depending on the decoding circuitry. The capacitance appearing across unblown antifuses 62, 88 and 98 has no effect on the operating speed of the memory array. There will, or course, be no capacitance across "blown" antifuse 74. The retention of full transistor decoupling elements results in substantial current gain at emitters 60, 72, 86 and 96, and thus minimizes both the programming current and the operational current fed into bases 54, 66, 80 and 90.

Figure 6:
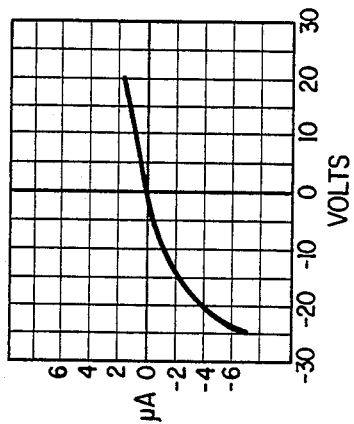
FIGS. 5-8 are IV curves for a tested bipolar memory cell fabricated according to the invention, showing the characteristics of the memory cell before and after the antifuse has been shorted.
Figure 8:
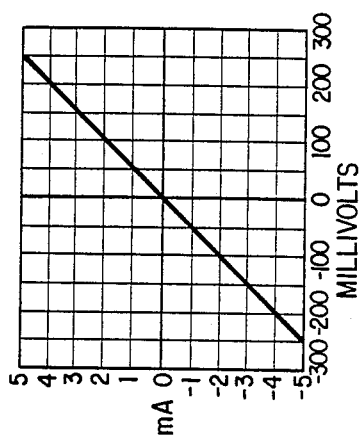
Figure 5:
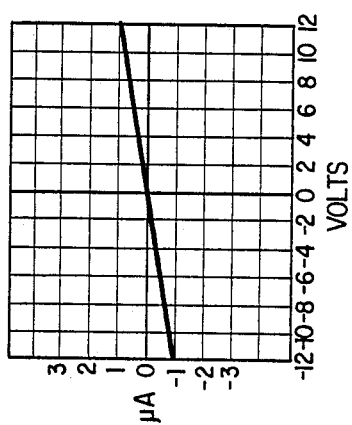

FIGS. 5-8 are graphs of the IV characteristics of a memory cell fabricated according to the invention, where the antifuse layer 48 illustrated in FIG. 3 is chosen to be about 6700 Angstroms thick. In FIG. 5, a programming voltage of 7.0 volts was applied across the memory cell to obtain the approximate IV operation curve shown. This curve shows an average cell resistance of about 20 Megohms which was measured by a picoammeter and voltmeter. FIG. 6 shows an IV operating characteristic of a memory cell similar to the one programmed in FIG. 5 after the application of a programming voltage of 12 volts. The antifuse is still not shorted. At 12 volts, the device begins to deviate away from a straight resistance-type plot, but still shows an average resistance of 5 Megohms even in the negative region.

Figure 7:
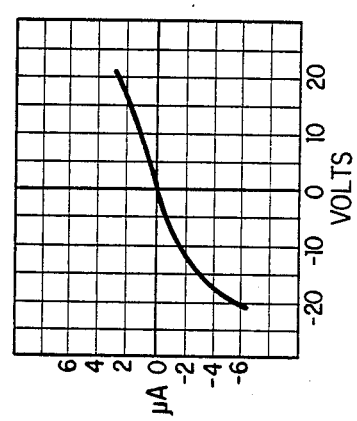

FIG. 7 is an IV characteristic curve of a like memory cell, where the applied programming voltage was 13 volts. This IV curve shows the fuse in the transistor region. Finally, in FIG. 8 the programming voltage of 15 volts was sufficient to short the antifuse and obtain a series resistance of about 50 ohms. The large difference between the average resistance measured by the IV curve in FIG. 6 and the IV curve in FIG. 8 demonstrates the sharp transition between the nonconductive state of this antifuse to its conductive state.

In general, the antifuse memory cell of the invention requires substantially lower programming and operating currents than conventional devices. For example, a bipolar decoupling element provided with a 3100 Angstrom-thick polysilicon antifuse according to the invention requires a programming current of only 3.12 milliamps, as compared to about a hundred milliamperes for conventional devices. Significant savings can therefore be realized in size of programming current devices, size and depth of the cell, and ultimately the size and current capabilities of devices peripheral to the memory cell array.

In summary, an antifuse memory cell has been described that is an improvement over conventional devices. Because the emitter-base junction of the bipolar decoupling element is not shorted out, a bipolar transistor remains after programming to provide faster switching of the circuit. Less programming current is needed. Lastly, the thickness of the polycrystalline or amorphous silicon antifuse can be varied to provide a specified required programming voltage, which cannot be accomplished with conventional blow-open links.

Although the preferred embodiment has been described in detail, it should be understood that various changes, substitutions and alterations can be made therein without departing from the spirit and scope of the invention as defined by the appended claims.

What is claimed is:

1. An antifuse for a memory cell having at least two cell selection lines, comprising:
   a transistor decoupling element having a base, a collector, and a emitter comprising polysilicon;
   one of said selection lines being located over the base of said transistor and in electrical contact therewith;
   an initially nonconductive antifuse layer;
   a refractory conductive layer beneath said nonconductive antifuse layer;

a silicide layer between said polysilicon of said emitter and said refractory conductive layer;

a nonrefractory metal layer on said antifuse layer;

said antifuse layer, said nonrefractory metal layer and said polysilicon of said emitter being in vertical alignment;

said nonrefractory metal layer providing another cell selection lines; whereby metal from said nonrefractory metal layer diffuses through said antifuse layer to said refractory conductive layer upon application of a predetermined minimum potential between said nonrefractory layer and the base of said transistor to provide a conductive path between said nonrefractory layer and said emitter.

2. The antifuse of claim 1, wherein said silicide layer on said emitter is platinum silicide.

3. The antifuse of claim 1 wherein said refractory conductive layer is a titanium tungsten alloy.

4. The antifuse of claim 1 wherein said nonrefractory metal is aluminum.

5. The antifuse of claim 1 wherein said antifuse is of amorphous silicon.

6. The antifuse of claim 5 wherein said amorphous silicon is undoped.

7. The antifuse of claim 6 wherein said antifuse layer has a thickness between about 500 Å and 3100 Å.

8. The antifuse of claim 1 wherein said predetermined minimum voltage is between about 4 to about 12 volts.

9. The antifuse of claim 1 further comprising a substrate in which at least the base and collector of said transistor are located, and a contact to the base of the transistor from a top surface of the substrate.

10. An antifuse product for a memory cell made by a process comprising the steps of:

providing a semiconductor substrate;

forming a bipolar transistor decoupling element at least partially in said substrate and having a base, a collector, and an emitter comprising at least a doped polysilicon portion;

forming, in vertical alignment with said doped polysilicon portion, a silicide layer atop the doped polysilicon portion, a refractory conductive layer atop said silicide layer, and initially insulating antifuse layer atop said refractory conductive layer, and a nonrefractory metal layer atop said antifuse layer;

providing cell selection lines one of which being located above the base of the transistor in electrical contact therewith, the other being provided by said nonrefractory metal layer;

whereby metal from the nonrefractory metal layer migrates through the antifuse layer to the refractory layer to short the antifuse layer upon application of a predetermined electric potential between the nonrefractory layer and the polysilicon portion.

11. The antifuse product made by the process of claim 10 and further comprising annealing said doped polysilicon portion to diffuse dopant therefrom into said substrate.

12. The antifuse product made by the process of claim 10 and further comprising forming said nonrefractory metal layer substantially from aluminum.

13. The antifuse product made by the process of claim 10 and further comprising forming said antifuse layer of amorphous silicon.

14. The antifuse product made by the process of claim 10 and further comprising programming said antifuse by selectively applying a potential between said refractory metal layer and said polysilicon portion of between about four and twelve volts.

* * * * *